United States Patent
Wen et al.

(10) Patent No.: US 11,212,611 B2
(45) Date of Patent: Dec. 28, 2021

(54) MEMS MICROPHONE AND MANUFACTURING METHOD THEREOF

(71) Applicants: Hangzhou Silan Integrated Circuit Co., Ltd., Hangzhou (CN); Hangzhou Silan Microelectronics CO., LTD., Hangzhou (CN)

(72) Inventors: Yongxiang Wen, Hangzhou (CN); Fuhe Sun, Hangzhou (CN); Chen Liu, Hangzhou (CN); Wenchao Jin, Hangzhou (CN); Wenliang Sun, Hangzhou (CN)

(73) Assignees: HANGZHOU SILAN INTEGRATED CIRCUIT CO., LTD., Hangzhou (CN); HANGZHOU SILAN MICROELECTRONICS CO., LTD., Hangzhou (CN)

( * ) Notice: Subject to any disclaimer, the term of this patent is extended or adjusted under 35 U.S.C. 154(b) by 0 days.

(21) Appl. No.: 16/750,231

(22) Filed: Jan. 23, 2020

(65) Prior Publication Data
US 2021/0168497 A1    Jun. 3, 2021

(30) Foreign Application Priority Data
Dec. 2, 2019 (CN) .......................... 201911215979.3

(51) Int. Cl.
*H04R 9/08*      (2006.01)
*H04R 11/04*     (2006.01)
(Continued)

(52) U.S. Cl.
CPC ......... *H04R 1/283* (2013.01); *B81C 1/00158* (2013.01); *B81B 2201/0257* (2013.01); *B81B 2203/0127* (2013.01); *H04R 2201/003* (2013.01)

(58) Field of Classification Search
CPC ........................... H04R 1/283; B81C 1/00158
See application file for complete search history.

(56) References Cited

U.S. PATENT DOCUMENTS

| | | | | |
|---|---|---|---|---|
| 5,196,257 A | * | 3/1993 | Barraud | B01D 69/122 427/434.3 |
| 2007/0201710 A1 | * | 8/2007 | Suzuki | H04R 31/006 381/174 |

(Continued)

FOREIGN PATENT DOCUMENTS

| CN | 108584863 A | 9/2018 |
|---|---|---|
| CN | 208429862 U | 1/2019 |

*Primary Examiner* — Simon King
(74) *Attorney, Agent, or Firm* — Westman, Champlin & Koehler, P.A.

(57) ABSTRACT

A MEMS microphone and a manufacturing method thereof. The method comprises: sequentially forming a first isolation layer, a diaphragm, and a second isolation layer on a substrate; sequentially forming a first protective layer, a backplate electrode, and a second protective layer on the second isolation layer; forming a release hole penetrating through the first protective layer, the backplate electrode, and the second protective layer; forming an acoustic cavity penetrating through the substrate; releasing the diaphragm through the acoustic cavity and the release hole; and forming a groove on a surface of the first isolation layer, wherein the diaphragm conformally covers the surface of the first isolation layer, thereby forming a spring structure at a position of the groove.

49 Claims, 12 Drawing Sheets

(51) Int. Cl.
  *H04R 17/02* (2006.01)
  *H04R 19/04* (2006.01)
  *H04R 21/02* (2006.01)
  *H04R 1/28* (2006.01)
  *B81C 1/00* (2006.01)

(56) References Cited

U.S. PATENT DOCUMENTS

| | | | | |
|---|---|---|---|---|
| 2010/0278372 | A1* | 11/2010 | Zhang | H04R 31/00 |
| | | | | 381/412 |
| 2016/0088402 | A1* | 3/2016 | Hu | H04R 19/04 |
| | | | | 381/174 |
| 2016/0286317 | A1* | 9/2016 | Zhao | H04R 19/04 |
| 2018/0359571 | A1* | 12/2018 | Zhan | H04R 19/005 |
| 2019/0306633 | A1* | 10/2019 | Yang | H04R 19/04 |
| 2020/0084549 | A1* | 3/2020 | Klein | H04R 19/005 |

* cited by examiner

104

104

MEMS MICROPHONE AND MANUFACTURING METHOD THEREOF

CROSS-REFERENCE TO RELATED APPLICATION

This application claims priority to the Chinese Patent Application No. 201911215979.3, filed on Dec. 2, 2019, entitled as 'MEMS MICROPHONE AND MENUFACTURING METHOD THEREOF', which is incorporated herein by reference in its entirety.

BACKGROUND OF THE DISCLOSURE

Field of the Disclosure

The disclosure relates to the micro technical field of microphone and, more particularly, to a MEMS microphone and a manufacturing method thereof.

Description of the Related Art

MEMS microphones are condenser microphones manufactured by using semiconductor technology, which are increasingly used in mobile terminals such as mobile phones due to their advantages of small size, high sensitivity, and good compatibility with existing semiconductor technology. The MEMS microphone has a structure including a diaphragm and a backplate electrode opposite to each other, and the diaphragm and backplate electrode are connected to corresponding electrodes through conductive paths, respectively. An isolation layer is further included between the diaphragm and the backplate electrode. The isolation layer is used to separate the diaphragm and the backplate, and a cavity is formed therein to provide a vibration space required by the diaphragm.

In an existing MEMS microphone, silicon nitride is used as a material of the backplate electrode. Silicon nitride has good rigidity so that the MEMS microphone can obtain good acoustic performance. However, when a designed distance between the diaphragm and the backplate electrode is short, in the step of wet-etching the isolation layer to form the cavity and during the application of the MEMS microphone, the diaphragm and the backplate electrode are easily adhered to each other, which causes device failure and reduces yield. The adhesion of microstructures in the MEMS microphone has become a main cause of failure products during micro-machining and application of the MEMS microphone, which has severely restricted the development and industrial application of the MEMS microphone.

As a further improved method, a process of HF acid vapor fumigation is used to remove a portion of the isolation layer to form the cavity. However, the process of HF acid vapor fumigation will cause corrosion on the backplate electrode, which causes device failure and reduces yield.

It is desirable to further improve the manufacturing method of the MEMS microphone to improve yield and reliability of device performance.

SUMMARY OF THE DISCLOSURE

An object of the present disclosure is to provide a MEMS microphone and a manufacturing method thereof, wherein, protective layers are formed on surfaces of a backplate electrode opposite to each other, thereby protecting the backplate electrode in an etching step of releasing a diaphragm, and after the step of releasing the diaphragm, a monomolecular layer of organic molecules is formed on at least an exposed surface of the diaphragm, so that yield and reliability of device performance can be improved.

According to one aspect of the disclosure, there is provided a manufacturing method of a MEMS microphone, comprising: sequentially forming a first isolation layer, a diaphragm, and a second isolation layer on a substrate; sequentially forming a first protective layer, a backplate electrode, and a second protective layer on the second isolation layer; forming a release hole penetrating through the first protective layer, the backplate electrode, and the second protective layer; forming an acoustic cavity penetrating through the substrate; releasing the diaphragm through the acoustic cavity and the release hole; and forming a groove on a surface of the first isolation layer between the step of forming the first isolation layer and the diaphragm, wherein the diaphragm conformally covers the surface of the first isolation layer, thereby forming a spring structure at a position of the groove.

Preferably, in the step of releasing the diaphragm, a portion of the first isolation layer is removed through the acoustic cavity, and a portion of the second isolation layer is removed through the release hole, thereby exposing a first surface and a second surface of the diaphragm opposite to each other.

Preferably, in the step of releasing the diaphragm, HF acid is used as an etchant, the diaphragm is used as a stop layer, the first protective layer and the second protective layer are used to protect the backplate electrode.

Preferably, after the step of releasing the diaphragm, the manufacturing method further comprises: forming a monomolecular layer of organic molecules on at least an exposed surface of the diaphragm.

Preferably, the manufacturing method further comprises: forming at least one additional film selected from a metal oxide film and a silicon oxide film on a surface of the monomolecular layer of organic molecules, wherein the additional film and the monomolecular layer of organic molecules form a stack structure.

Preferably, in the step of releasing the diaphragm, a cavity is formed between the first protective layer and the diaphragm.

Preferably, the monomolecular layer of organic molecules covers an inner surface communicating with an external environment and an outer surface of the MEMS microphone.

Preferably, in the step of forming a monomolecular layer of organic molecules, the monomolecular layer of organic molecules covers an exposed surface of the first protective layer in the cavity.

Preferably, the diaphragm and the backplate electrode are each composed of doped polysilicon.

Preferably, each of the first protective layer and the second protective layer is composed of any one selected from silicon nitride, boron nitride, and silicon carbide.

Preferably, the spring structure of the diaphragm is a fold portion of a concentric annular, or a fold portion of a spiral structure.

Preferably, the spring structure of the concentric annular comprises one to six circular rings.

Preferably, the spring structure of the spiral structure comprises at least one spiral pattern, and the spiral pattern radiates outward from a middle portion of the diaphragm.

Preferably, the manufacturing method further comprises: forming reinforcing ribs in a peripheral portion of the diaphragm.

Preferably, the reinforcing ribs of the diaphragm are radial strip beams or side wall structure in the peripheral portion.

Preferably, the manufacturing method further comprises: forming a discontinuous region in a part of the peripheral portion of the diaphragm.

Preferably, a plurality of protrusions are formed on a surface of the first protective layer facing the diaphragm, to prevent adhesion between the backplate and the diaphragm.

Preferably, the manufacturing method further comprises: between the steps of forming the backplate electrode and the second protective layer, patterning the backplate electrode.

Preferably, the manufacturing method further comprises: in a region where a portion of the backplate electrode is removed during patterning, a first conductive path is formed that passes through the second protective layer, the first protective layer, and the second isolation layer and reaches a surface of the diaphragm; and in a region where a portion of the backplate electrode is remained during patterning, a second conductive path is formed that passes through the second protective layer and reaches a surface of the backplate electrode.

Preferably, the monomolecular layer of organic molecules is composed of any one of organosilane and organosiloxane.

Preferably, the backplate electrode is formed above a movable region of the diaphragm, and an area of the backplate electrode is less than or equal to that of the movable area of the diaphragm.

Preferably, an area of the backplate electrode is less than or equal to a minimum cross-sectional area of the acoustic cavity.

Preferably, a minimum cross-sectional radius of the acoustic cavity is from 385 µm to 415 µm.

Preferably, the first protective layer and the second protective layer have different thicknesses.

Preferably, the first protective layer has a thickness from 800 angstroms to 1500 angstroms, and the second protective layer has a thickness from 0.1 µm to 1.0 µm.

Preferably, the first protective layer and the second protective layer have different materials.

According to the other aspect of the disclosure, there is provided a MEMS microphone, comprising: a first isolation layer, a diaphragm, and a second isolation layer sequentially formed on a substrate; a first protective layer, a backplate electrode, and a second protective layer sequentially formed on the second isolation layer; a release hole penetrating through the first protective layer, the backplate electrode, and the second protective layer; a cavity penetrating through the second isolation layer, wherein the cavity communicates with the release hole; an acoustic cavity penetrating through the substrate and the first isolation layer; and a spring structure provided on a surface of the diaphragm, wherein a first and second surfaces of the diaphragm opposite to each other are exposed through the cavity and the acoustic cavity, respectively.

Preferably, the MEMS microphone further comprises: a monomolecular layer of organic molecules covering at least an exposed surface of the diaphragm.

Preferably, the acoustic cavity and the release hole provide an airflow path during the vibration of the diaphragm.

Preferably, the MEMS microphone further comprises: at least one additional film formed on a surface of the monomolecular layer of organic molecules and selected from a metal oxide film and a silicon oxide film, and the additional film and the monomolecular organic film forms a stack structure.

Preferably, the monomolecular layer of organic molecules covers an inner surface for connecting to an external environment and an outer surface of the MEMS microphone.

Preferably, the monomolecular layer of organic molecules covers an exposed surface of the first protective layer in the cavity.

Preferably, the diaphragm and the backplate electrode are each composed of doped polysilicon.

Preferably, each of the first protective layer and the second protective layer is any one selected from the group of a silicon nitride layer, a boron nitride layer, and a silicon carbide layer, the first protective layer and the second protective layer have different materials.

Preferably, the spring structure of the diaphragm is a fold portion of a concentric annular, or a fold portion of a spiral structure.

Preferably, the spring structure of the concentric annular comprises one to six circular rings.

Preferably, the spring structure of the spiral structure comprises at least one spiral pattern, and the spiral pattern radiates outward from a middle portion of the diaphragm.

Preferably, the MEMS microphone further comprises: reinforcing ribs formed in a peripheral portion of the diaphragm.

Preferably, the reinforcing ribs of the diaphragm are radial strip beams or side wall structure in the peripheral portion.

Preferably, the MEMS microphone further comprises: a discontinuous region formed in a part of the peripheral portion of the diaphragm.

Preferably, the MEMS microphone further comprises: a first conductive path passing through the second protective layer, the first protective layer, and the second isolation layer to reach a surface of the diaphragm; and a second conductive path passing through the second protective layer to reach a surface of the backplate electrode.

Preferably, the monomolecular layer of organic molecules is composed of any one of an organosilane layer and an organosiloxane layer.

Preferably, a plurality of protrusions are formed on a surface of the first protective layer facing the diaphragm, to prevent adhesion between the backplate and the diaphragm.

Preferably, the backplate electrode is formed above a movable region of the diaphragm, and an area of the backplate electrode is less than or equal to that of the movable area of the diaphragm.

Preferably, an area of the backplate electrode is less than or equal to a minimum cross-sectional area of the acoustic cavity.

Preferably, an area of the backplate electrode is from 70% to 100% of the movable region.

Preferably, the diaphragm further comprises: a middle portion and a peripheral portion being connected by the spring structure, and the movable region of the diaphragm comprises a region corresponding the middle portion and a region corresponding to the spring structure.

Preferably, a minimum cross-sectional radius of the acoustic cavity is from 385 µm to 415 µm.

Preferably, the backplate electrode has a thickness from 0.3 µm to 1.0 µm.

Preferably, the first protective layer and the second protective layer have different thicknesses.

Preferably, the first protective layer has a thickness from 800 angstroms to 1500 angstroms, and the second protective layer has a thickness from 0.1 µm to 1.0 µm.

Preferably, the monomolecular layer of organic molecules has a thickness from 1 nm to 10 nm.

According to the manufacturing method of the MEMS microphone provided by the embodiments of the present disclosure, in the etching step of releasing the diaphragm, the first protective layer and the second protective layer are used to protect the backplate electrode, so that when the diaphragm in the device structure is released, the backplate electrode cannot be corroded, which improves device performance and reliability. And by forming the annular groove on the surface of the first isolation layer between the step of forming the first isolation layer and the diaphragm, the diaphragm conformally covers the surface of the first isolation layer to form the spring structure at the position of the groove.

Further, the spring structure of the diaphragm is a fold portion of a concentric annular or a fold portion of a spiral structure. The spring structure of the diaphragm effectively releases the stress of the diaphragm and improves the sensitivity of the MEMS microphone.

In a preferred embodiment, after the diaphragm is released, the monomolecular layer of organic molecules is formed on at least an exposed surface of the diaphragm. The hydrophobicity and low surface adhesion of the monomolecular layer of organic molecules can be effectively reduced or prevent adhesion between the diaphragm and the backplate electrode, thereby improving yield and reliability of device performance. The monomolecular layer of organic molecules does not give significant adverse effects on electrical performance of the MEMS microphone, so that it can meet device performance requirements.

In a preferred embodiment, in the etching step of the release the diaphragm, the release hole and the acoustic cavity that have been formed are used as a supply path of reaction gas, so that the reaction gas easily enters the internal cavity of the MEMS microphone. Therefore, the monomolecular layer of organic molecules can be formed on the inner surface of the MEMS microphone to form a high-quality anti-adhesion layer.

In a preferred embodiment, by using the backplate electrode the area of which is less than or equal to the area of the movable area of the diaphragm, the influence of parasitic capacitance that does not contribute to the sensitivity of the MEMS microphone can be reduced. Even if process fluctuations exist, since the backplate electrode only needs to be aligned with the movable area of the diaphragm, the two ones can be easily aligned. Therefore, an invalid capacitance component can be removed from a detection signal, so that the sensitivity of the detection signal is only relative to valid capacitance component, so that the sensitivity of the MEMS microphone is increased.

In a preferred embodiment, by using the backplate electrode the area of which is less than or equal to the cross-sectional area of the acoustic cavity, the problem of reliability reduction of the MEMS microphone caused by process fluctuations in mass production can be avoided, so that whole product performance can be improved.

In a preferred embodiment, the materials of the first protective layer and the second protective layer are different, so that the corrosion resistance of the backplate electrode can be improved.

In a preferred embodiment, the diaphragm further includes the reinforcing ribs in the peripheral portion of the diaphragm, so that the elastic characteristic of the diaphragm, elastic coefficient of the diaphragm and the resonance frequency of the mechanical structure can be improved, the movable region can be controlled, and the performance design requirements of the MEMS microphone can be meet.

In a preferred embodiment, some regions of the peripheral portion of the diaphragm are discontinuous regions. The discontinuous regions of the diaphragm cannot form capacitors with upper and lower dielectric layers, thereby reducing parasitic capacitance which contributes adverse effects to the sensitivity of the MEMS microphone. At the same time, the discontinuous regions can release a part of stress of the diaphragm, which effectively improves the sensitivity of the diaphragm.

Further, various steps of the manufacturing method of the MEMS microphone are compatible with existing semiconductor processes, especially with the CMOS process, and thus the method can be used for low-cost mass-production.

BRIEF DESCRIPTION OF THE DRAWINGS

The above and other objects, features and advantages of the present disclosure will become more apparent from the description below with reference to the accompanying drawings.

DETAILED DESCRIPTION OF THE DISCLOSURE

Figure 1:
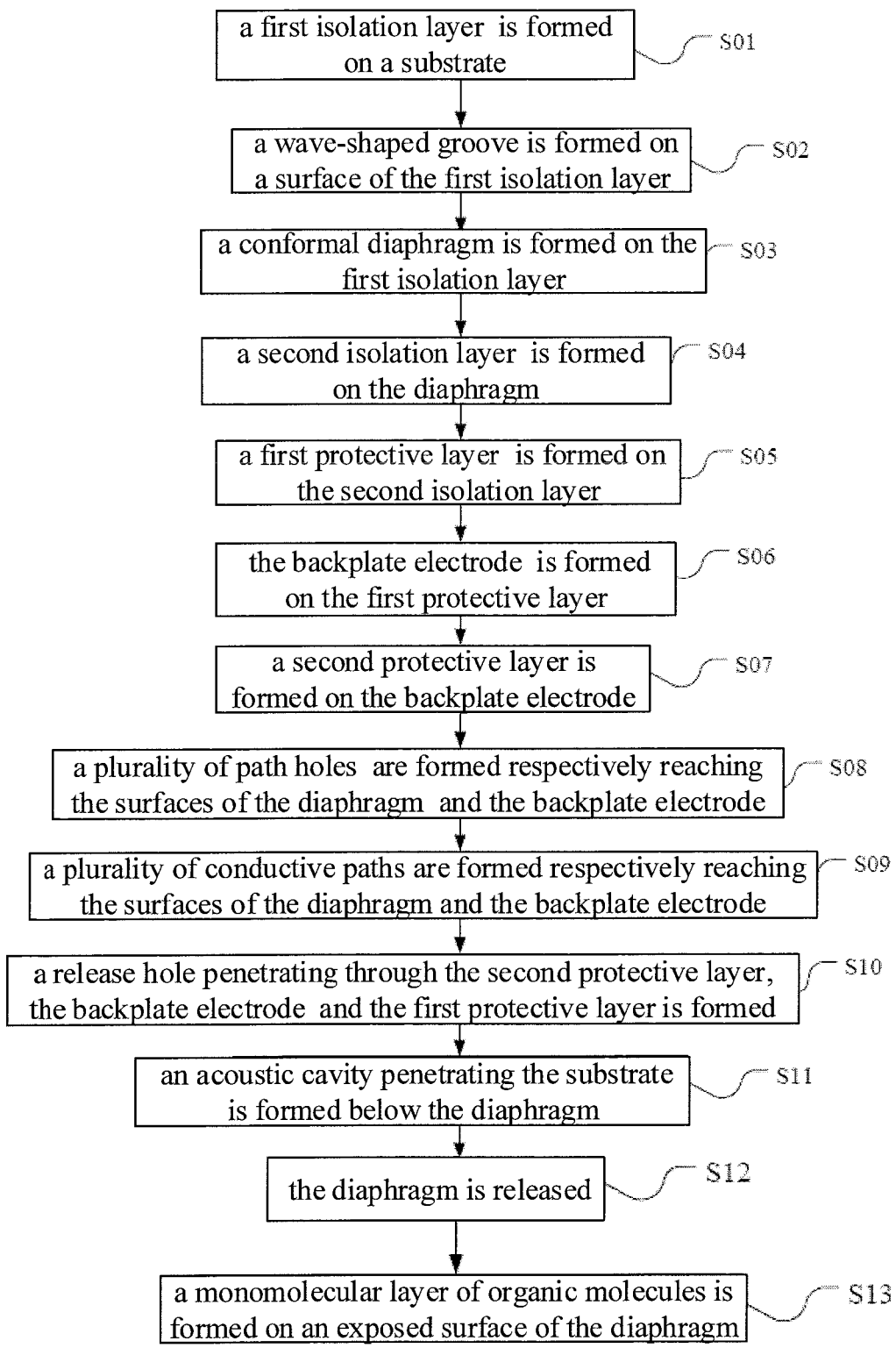
FIG. 1 is a flow schematic diagram of a manufacturing method of a MEMS microphone according to an embodiment of the present disclosure.

Various embodiments of the present disclosure will be described in more detail below with reference to the accompanying drawings. In the various figures, the same elements are denoted by the same or similar reference numerals. For the sake of clarity, the various parts in the figures are not drawn to scale.

The present disclosure can be embodied in various forms, some of which are described below.

As shown in FIG. 1, the manufacturing method for a MEMS microphone according to an embodiment may include following steps.

Figure 2:
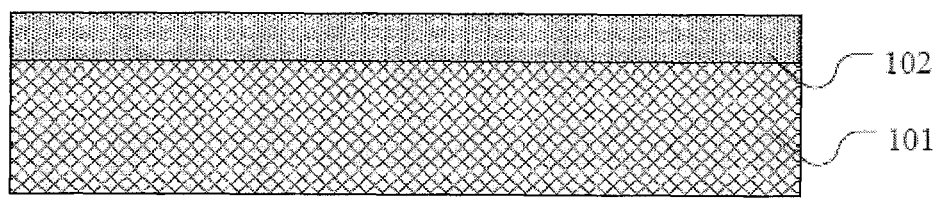
FIG. 2 to 14 are cross-sectional schematic diagrams corresponding to various steps of a manufacturing method of a MEMS microphone according to an embodiment of the present disclosure.

In step S01, a first isolation layer 102 is formed on a substrate 101, as shown in FIG. 2.

In the embodiment, the substrate 101 is, for example, a 100-oriented crystal silicon wafer. Alternatively, the substrate is doped to be N-type. The first isolation layer is, for example, a silicon oxide layer. For example, the silicon oxide layer is formed on the substrate 101 as the first isolation layer 102 by a thermal oxidation method or a Chemical Vapor Deposition (CVD) method.

A portion of the first isolation layer 102 serves as a sacrificial layer for forming a part of an acoustic cavity below a diaphragm, and the thickness of the first isolation layer 102 is also used to define a distance between the diaphragm and the substrate. The thickness of the first isolation layer 102 is, for example, 0.5 µm to 2 µm.

Figure 3:
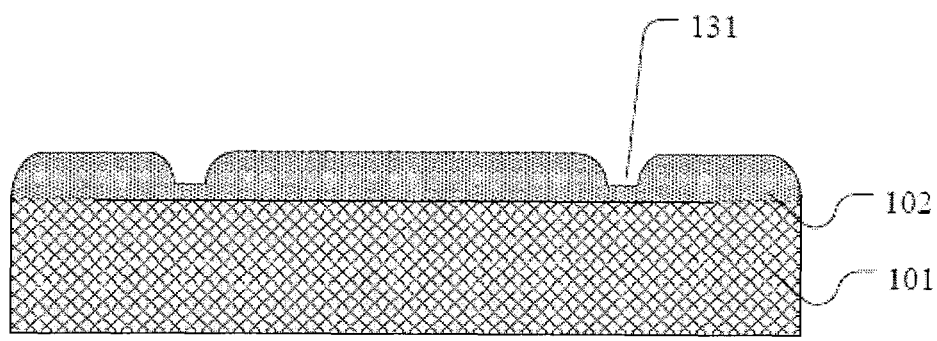

In step S02, a wave-shaped groove 131 is formed on a surface of the first isolation layer 102, as shown in FIG. 3.

In the embodiment, a resist layer is formed on the surface of the first isolation layer 102, and a pattern including opening is formed in the resist layer by using a photolithography process. With the resist layer as a mask, a selective etchant is used to remove an exposed portion of the first isolation layer 102. By controlling etching time, the etching can be stopped at a predetermined depth of the first isolation layer 102. After the etching, the resist layer can be removed by ashing or dissolving in a solvent.

An opening of the groove 131 is on the surface of the first isolation layer 102 and extends downward. Viewed from the surface of the first isolation layer 102, the shape of the groove 131 is a concentric ring, for example, it can include 1 to 6 nested circular rings. Viewed from cross sections of the first isolation layer 102, the shape of the groove 131 is a substantially trapezoidal shape or a V-shape, and the size of the bottom surface of the groove 131 is smaller than that of the opening surface. The depth of the groove 131 is, for example, 0.5 µm to 0.8 µm. Preferably, the opening surface of the groove 131 and the surface of the first isolation layer 102 form a smooth curved surface. The groove 131 is used to define a spring structure of the diaphragm, which is formed in a subsequent step.

Figure 4:
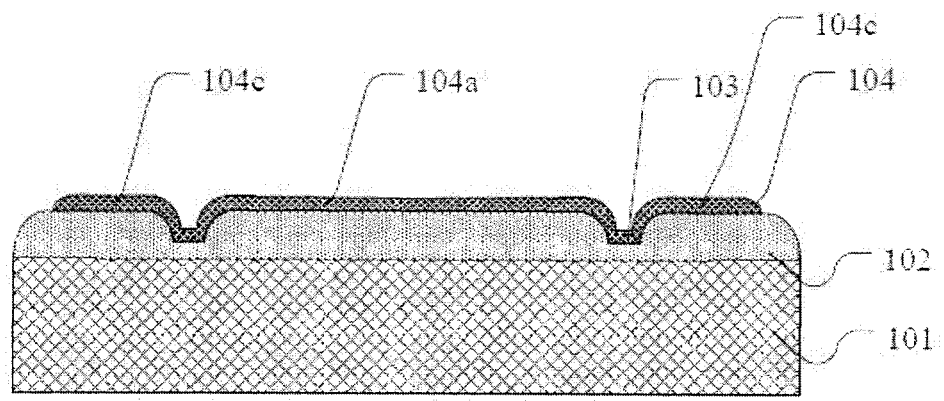

In step S03, a conformal diaphragm 104 is formed on the first isolation layer 102, as shown in FIG. 4.

In the embodiment, the diaphragm 104 is composed of, for example, doped polysilicon. For example, Low Pressure Chemical Vapor Deposition (LPCVD) is used to deposit polysilicon on the first isolation layer 102 to form the diaphragm 104, and the deposition temperature is, for example, 570 degrees Celsius to 630 degrees Celsius. A first portion of the diaphragm 104 covers the surface of the first isolation layer 102, and a second portion is continuous with the first portion and conformally covers the bottom surface and the side surface of the groove 131, so that a spring structure 103 is formed. The thickness of the diaphragm 104 is, for example, 0.3 µm to 1 µm, and preferably 0.4 µm. The first portion of the diaphragm 104 includes a middle portion 104a and a peripheral portion 104c, and the spring structure 103 connects the middle portion 104a to the peripheral portion 104c. The middle portion 104a and the spring structure 103 of the diaphragm 104 constitute a movable region of the diaphragm 104.

Figure 15A:
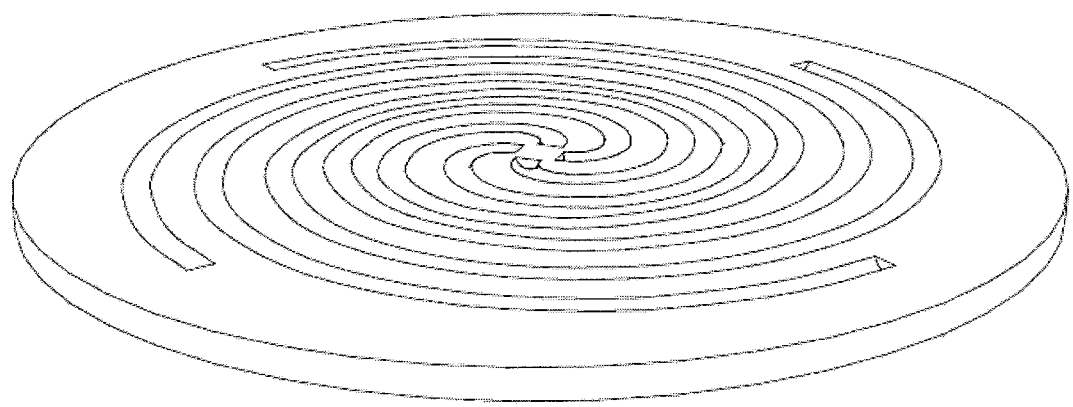
FIG. 15a is a structural schematic diagram showing a type of diaphragm in a MEMS microphone according to a first embodiment of the present disclosure.
Figure 15B:
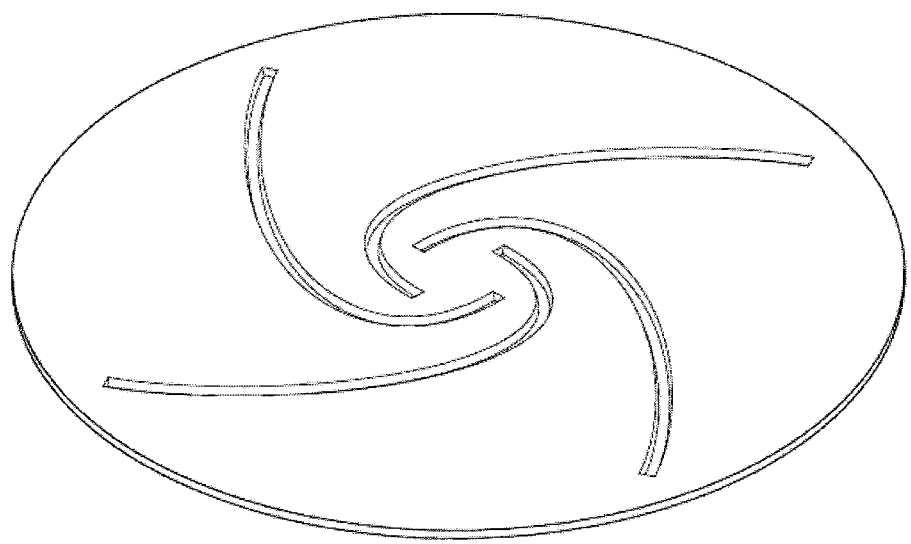
FIG. 15b is a structural schematic diagram showing another type of diaphragm in a MEMS microphone according to a first embodiment of the present disclosure.

In the embodiment, the middle portion 104a and the peripheral portion 104c of the diaphragm 104 are both flat surfaces, and the spring structure 103 of the diaphragm 104 is a fold portion of a concentric annular. In an alternative embodiment, the spring structure 103 of the diaphragm 104 is a fold portion of a spiral structure (as shown in FIGS. 15a and 15b). In these two embodiments, the spring structure in FIG. 15a has dense threads, and the radius of curvature of spiral patterns does not change with positions, the spring structure in FIG. 15b has sparse threads, and the radius of curvature of spiral patterns changes with positions. These two embodiments can be chosen in accordance with the requirements of the actual application. Compared with a flat-surface diaphragm, the diaphragm 104 having the spring structure formed on the surface can improve elastic characteristic of the diaphragm, control movable region, improve elastic coefficient of the diaphragm, and meet performance design requirements of the MEMS microphone. In an alternative embodiment, the middle portion of the diaphragm 104 is recessed downward, and the recessed depth of the middle portion is the same as the depth of the spiral patterns of the spring structure. In a preferred embodiment, the radius of curvature of each spiral pattern is the same. In an alternative embodiment, the spring structure is located in the whole diaphragm 104, that is, the middle portion and the peripheral portion of the diaphragm 104 are served as the spring structure. The stress of the diaphragm is effectively released, so that the sensitivity of the MEMS microphone is improved.

Preferably, the step may include forming a wiring structure connected to the diaphragm 104. For example, photolithography and etching steps are used to pattern the polysilicon layer, so that different regions of the polysilicon layer are patterned into the diaphragm and the wiring structure, respectively.

Figure 16A:
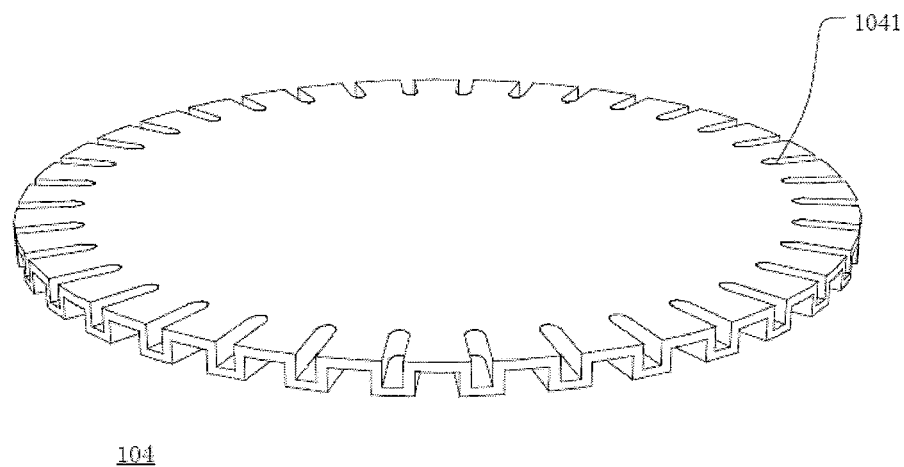
FIG. 16a is a structural schematic diagram showing a type of diaphragm in a MEMS microphone according to a second embodiment of the present disclosure.
Figure 16B:
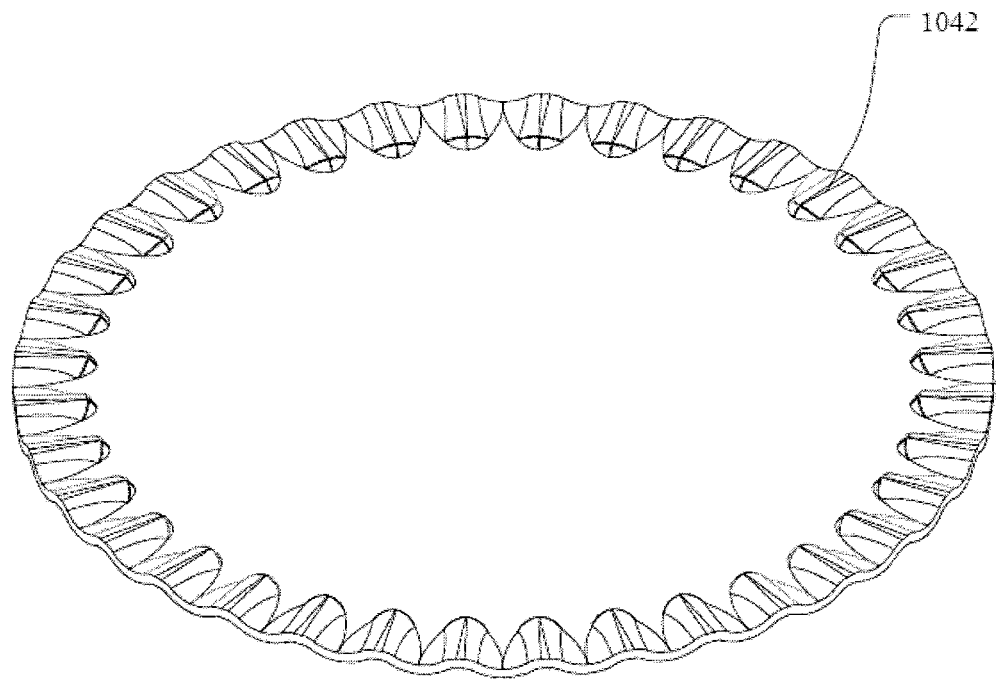
FIG. 16b is a structural schematic diagram showing another type of diaphragm in a MEMS microphone according to a second embodiment of the present disclosure.

In a preferred embodiment, the diaphragm 104 further includes reinforcing ribs formed in the peripheral portion 104c (as shown in FIGS. 16a and 16b). As shown in FIG. 16a, the reinforcing ribs 1041 of the diaphragm 104 are, for example, radial strip beams or side wall structure located in the peripheral portion 104c. The side wall structure includes a plurality of annular sections, the plurality of annular sections have a same radius and show a rectangular wave shape. In an alternative embodiment, the diaphragm 104 further includes reinforcing ribs 1042 formed in the peripheral portion 104c (as shown in FIG. 16b). The reinforcing ribs 1042 of the diaphragm 104 include a plurality of annular sections, the plurality of annular sections have a same radius and show a trapezoidal wave with inclination, sinusoidal wave and the like, and the junctions of the annular sections have circular arcs. Compared with the flat-surface diaphragm 104, the diaphragm 104 with the spring structure 104b and the reinforcing ribs formed in the surface can improve elastic characteristic of the diaphragm, elastic coefficient of the diaphragm and the resonance frequency of the mechanical structure, control movable region, and meet performance design requirements of the MEMS microphone. In a preferred embodiment, the reinforcing ribs formed in the peripheral portion 104c of the diaphragm 104 is side wall structure. The side wall structure includes a plurality of annular sections, and the plurality of annular sections show a rectangular wave shape, a trapezoidal wave with inclination, sinusoidal wave or the like, and the junctions of the annular sections have circular arcs.

Figure 5:
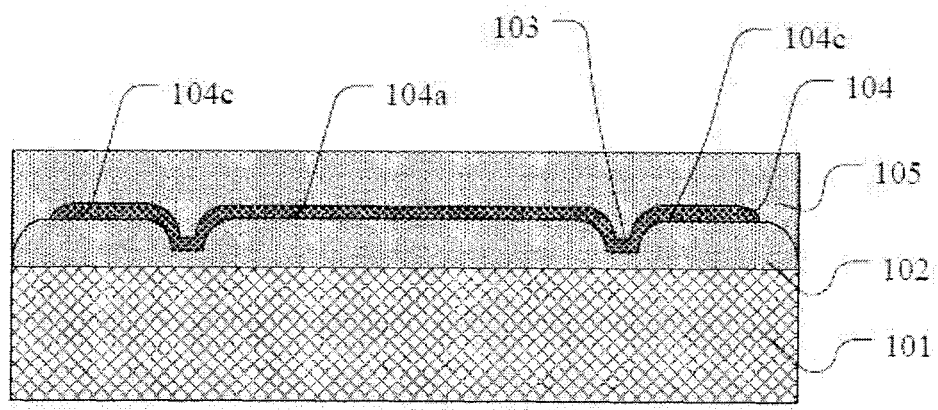
Figure 17A:
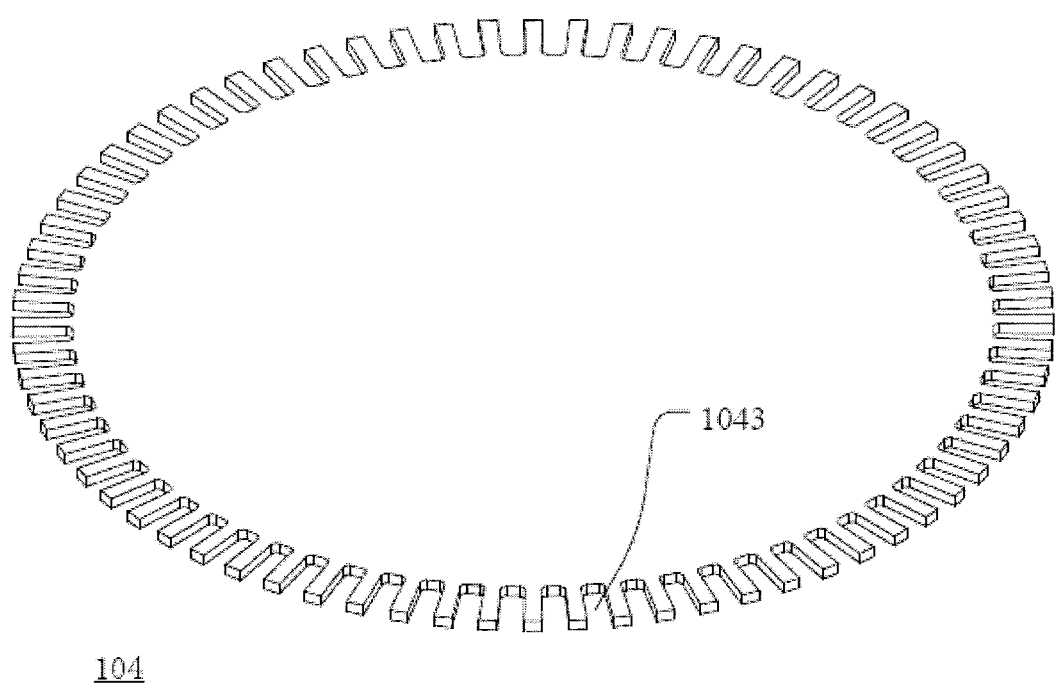
FIG. 17a is a structural schematic diagram showing a type of diaphragm in a MEMS microphone according to a third embodiment of the present disclosure.
Figure 17B:
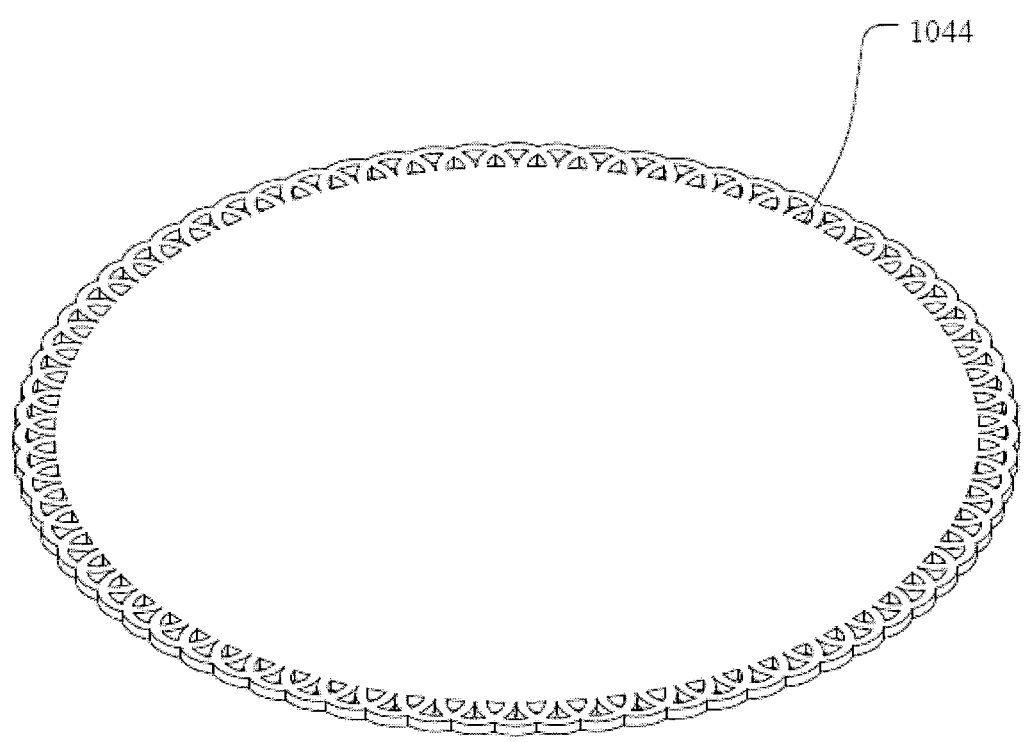
FIG. 17b is a structural schematic diagram showing another type of diaphragm in a MEMS microphone according to a third embodiment of the present disclosure.

In a preferred embodiment, some regions of the peripheral portion 104c of the diaphragm 104 are discontinuous regions (as shown in FIGS. 17a and 17b). As shown in FIG. 17a, the edge of the peripheral portion of the diaphragm 104 is discontinuous. Specifically, the edge of the peripheral portion 104c is zigzag, and a plurality of zigzag-shaped notches 1043 form the discontinuous regions. In an alternative embodiment, as shown in FIG. 17b, the discontinuous regions of the peripheral portion 104c of the diaphragm 104 include a hollow structure. Specifically, the hollow structure includes a plurality of through holes 1044. The through holes 1044 are circular, trapezoidal, or polygonal. In the embodiment, the through holes 1044 have a fan-like shape and are formed in a staggered arrangement in the peripheral portion of the diaphragm 104. Further, the shape of the diaphragm 104 is a "sun flower shape", more specifically, the edge of the diaphragm 104 is connected by a plurality of arc edges. In step S04, a second isolation layer 105 is formed on the diaphragm 104, as shown in FIG. 5.

In the embodiment, the second isolation layer 105 is, for example, a silicon oxide layer. For example, any one of Low Pressure Chemical Vapor Deposition (LPCVD) and Plasma Enhanced Chemical Vapor Deposition (PECVD) is used to form a silicon oxide layer on the diaphragm 104 as the second isolation layer 105.

A part of the second isolation layer 105 serves as a sacrificial layer for forming a cavity above the diaphragm 104, and the thickness of the second isolation layer 105 is also used to define a distance between the diaphragm and a backplate electrode. The thickness of the second isolation layer 105 can be chosen in accordance with electrical and acoustic performance of the MEMS microphone, for example, 2 µm to 4 µm.

Figure 6:
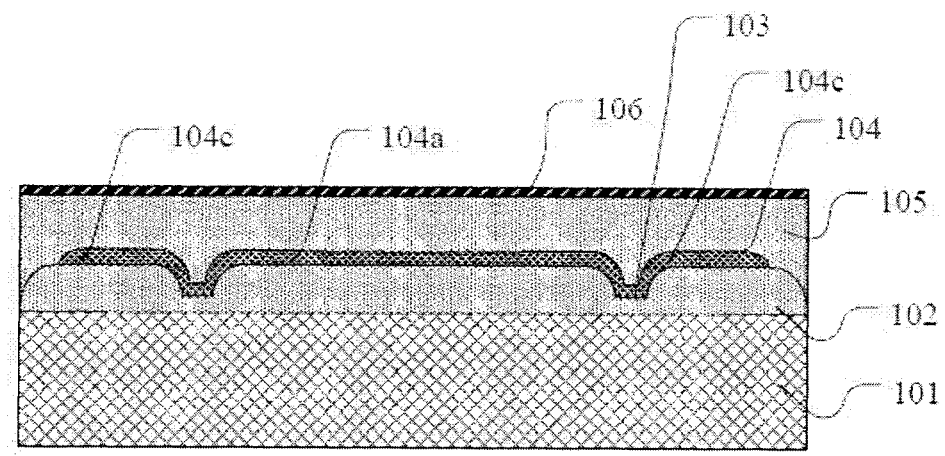

In step S05, a first protective layer 106 is formed on the second isolation layer 105, as shown in FIG. 6.

The first protective layer 106 is made of, for example, any one of silicon nitride, boron nitride, and silicon carbide. In the embodiment, the first protective layer 106 is, for example, a boron nitride layer. For example, hot-wire-assisted Plasma Enhanced Chemical Vapor Deposition (PECVD) is used to form the boron nitride layer on the second isolation layer 105, wherein, $N_2$, $H_2$ and $B_2H_6$ diluted by $H_2$ are used as reaction gas, and the temperature of the substrate is 400 degrees Celsius to 500 degrees Celsius, and the reaction pressure is about 100 Pa. The thickness of the first protective layer 106 is, for example, 800 angstroms to 1500 angstroms.

In a preferred embodiment, before step S05, the method further includes forming a resist layer on the surface of the second isolation layer 105, and a photolithography process is used to form a pattern including opening in the resist layer. With the resist layer as a mask, an exposed portion of the second isolation layer 105 is removed by using a selective etchant, so that an open pore is formed. By controlling etching time, the etching can be stopped at a predetermined depth of the second isolation layer 105. After the etching, the resist layer can be removed by ashing or dissolving in a solvent. The open pore has the opening on the surface of the second isolation layer 105 and extends downward. Viewed from the surface of the second isolation layer 105, the shape of the open pore is a plurality of circular holes, a plurality of square holes, or a plurality of triangular holes. Viewed from cross sections of the second isolation layer 105, the shape of the open pore is a substantially trapezoidal shape or a V-shape and the size of the bottom surface of the open pore is smaller than that of the opening surface. The diameter of the open pore is, for example, 0.5 µm to 1.5 µm, and the depth is, for example, 0.5 µm to 1.5 µm. The open pore is used to define protrusions for preventing the backplate electrode from adhering, which are formed in a subsequent step. Next, in step S05, the first protection layer 106 is formed on the second isolation layer 105, and the first protection layer 106 fills the open pore on the surface of the second isolation layer 104, thereby forming the protrusions correspondingly. The shape of the protrusion is consistent with the shape of the open pore, for example, any of the following: a polygonal pyramid, a polygonal prism, or a cylinder. The diameter of the protrusion is, for example, 0.5 µm to 1.5 µm, and the depth is, for example, 0.5 µm to 1.5 µm.

Figure 7:
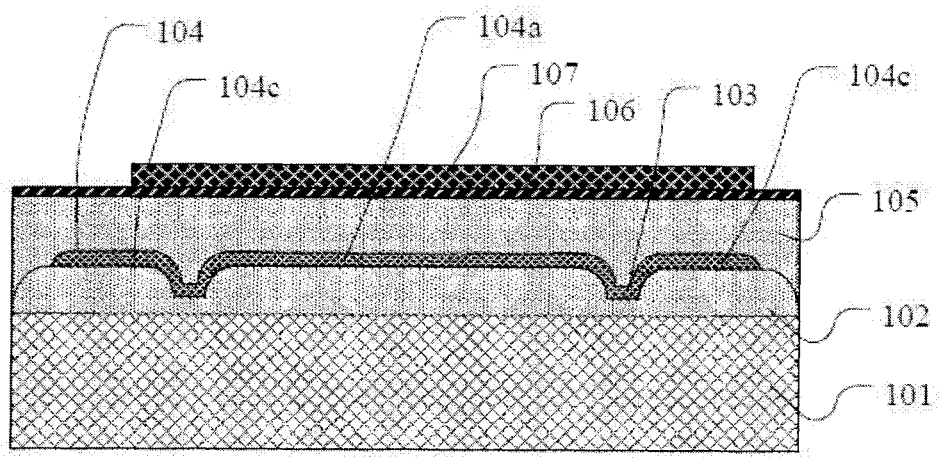

In step S06, the backplate electrode 107 is formed on the first protective layer 106, as shown in FIG. 7.

In the embodiment, the backplate electrode 107 is a conductive layer, for example, composed of doped polysilicon. For example, Low Pressure Chemical Vapor Deposition (LPCVD) is used to form a doped polysilicon layer on the first protective layer 106. Then, the polysilicon layer is patterned by using photolithography and etching to form a pattern of the backplate electrode 107. Further, the temperature at which the back plate electrode 107 is deposited is 570 degrees Celsius to 630 degrees Celsius, and the thickness of the backplate electrode 107 is 0.3 µm to 1.0 µm. In a preferred embodiment, the area of the backplate electrode 107 is less than or equal to the area of the movable region of the diaphragm 104. More preferably, the area of the backplate electrode 107 is 70% to 100% of the area of the movable region of the diaphragm 104. By using the backplate electrode the area of which is less than or equal to the area of the movable area of the diaphragm, invalid capacitance component can be removed from a detection signal, so that the sensitivity of the detection signal is only relative to valid capacitance component, thereby increasing the sensitivity of the MEMS microphone.

Figure 8:
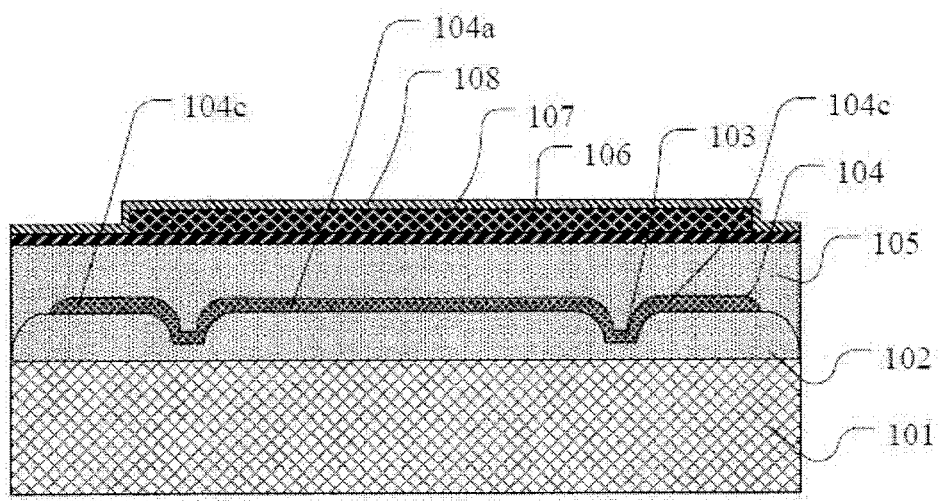

In step S07, a second protective layer 108 is formed on the backplate electrode 107, as shown in FIG. 8.

The second protective layer 108 is made of, for example, any one of silicon nitride, boron nitride, and silicon carbide. In the embodiment, the second protective layer 108 is, for example, a boron nitride layer. For example, any one of hot-wire-assisted Plasma Enhanced Chemical Vapor Deposition (PECVD) and Low Pressure Chemical Vapor Deposition (LPCVD) is used to form the boron nitride layer from 0.1 µm to 1.0 µm on the backplate electrode 107, wherein, $N_2$, $H_2$, and $B_2H_6$ diluted by $H_2$ are used as reaction gas, and the temperature of the substrate is 400 degrees Celsius to 500 degrees Celsius, and the reaction pressure is about 100 Pa. The thickness of the second protective layer 108 is, for example, 0.1 µm to 1.0 µm. The first protective layer 106, the backplate electrode 107, and the second protective layer 108 constitute a backplate structure.

Since the backplate electrode 107 is patterned, a first portion of the second protective layer 108 is formed on the surface of the backplate electrode 107, and a second portion is formed on the surface of the first protective layer 106.

Figure 9:
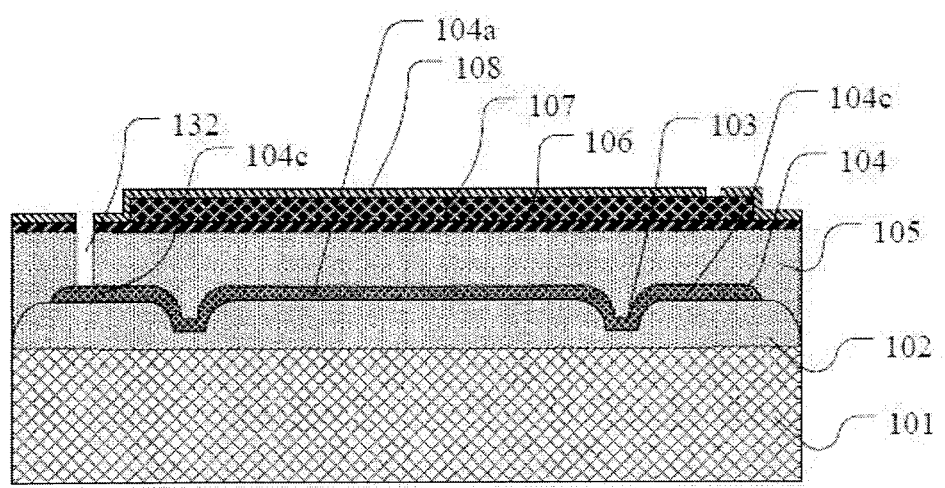

In step S08, a plurality of path holes 132 are formed respectively reaching the surfaces of the diaphragm 104 and the backplate electrode 107, as shown in FIG. 9.

In the embodiment, a resist layer is formed on the surface of the second protective layer 108, and a pattern including an opening is formed in the resist layer by using a photolithography process. The resist layer is used as a mask, and a selective etchant is used to form the plurality of path holes 132. Due to the selectivity of the etchant, the etching uses the diaphragm 104 and the backplate electrode 107 as stop layers. In the first portion of the second protective layer 108, the etching removes the portion of the second protective layer 108 exposed by the opening of the mask to form path holes 132 reaching the backplate electrode 107. In the second portion of the second protective layer 108, the etching, from the top to the bottom, removes the portions of the second protective layer 108, the first protective layer 106, and the second isolation layer 105 each exposed by the opening of the mask, to form the path holes 132 reaching the diaphragm 104. After the etching, the resist layer can be removed by ashing or dissolving in a solvent.

Alternatively, due to the patterning step of the backplate electrode 107 described above, the second portion of the second protective layer 108 is in direct contact with a corresponding portion of the first protective layer 106. At least one path hole 132 starts from the surface of the second portion of the second protective layer 108, and extends to the diaphragm 104 below the backplate electrode 107 through the second protective layer 108, the first protective layer 106 and the second isolation layer 105.

Figure 10:
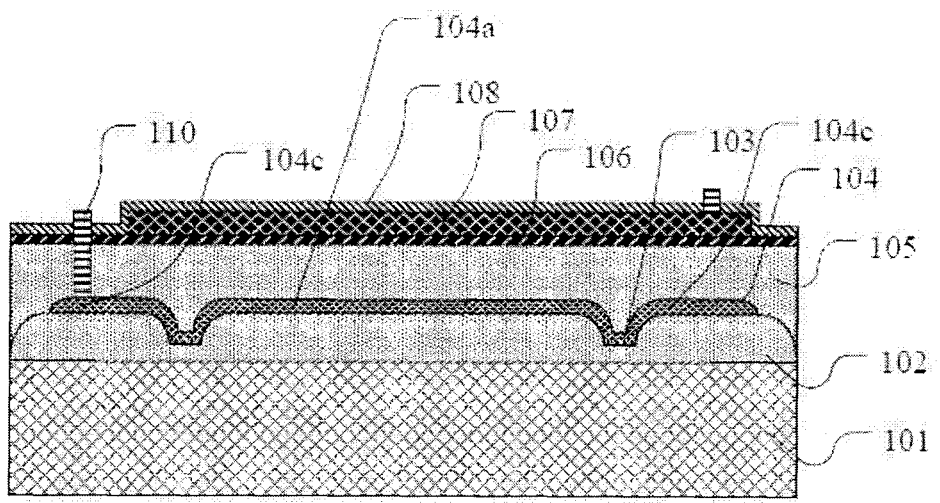

In step S09, a plurality of conductive paths 110 are formed respectively reaching the surfaces of the diaphragm 104 and the backplate electrode 107, as shown in FIG. 10.

In the embodiment, the conductive path 110 is composed of a conductive material, for example, any one selected from aluminum, gold, silver, copper, nickel, titanium, chromium, and alloy thereof. Aluminum alloy used for the conductive path 110 includes, for example, aluminum-silicon alloy (1% silicon by weight) and titanium alloy including titanium nitride. For example, a metal layer is formed on the surface of the second protective layer 108 by a sputtering or evaporation method. The thickness of the metal layer is, for example, 1 μm to 2 μm, and the plurality of path holes 132 are filled.

A resist layer is formed on the surface of the metal layer, and a pattern including opening is formed in the resist layer by a photolithography process. By using a resist layer as a mask, a selective etchant is used to remove an exposed portion of the metal layer. Due to the selectivity of the etchant, the etching uses the second protective layer 108 as a stop layer. After the etching, the resist layer can be removed by ashing or dissolving in a solvent.

In the first portion of the second protective layer 108, at least one conductive path 110 passes through the second protective layer 108 and reaches the backplate electrode 107. In the second portion of the second protective layer 108, at least one path hole 110 passes through the second protective layer 108, the first protective layer 106, and the second isolation layer 105 in sequence to reach the diaphragm 104.

Alternatively, due to the patterning of the backplate electrode 107 and the conductive paths 110 described above, at least one of the plurality of conductive paths 110 extends to the diaphragm 104 and is separated from the backplate electrode 107.

Figure 11:
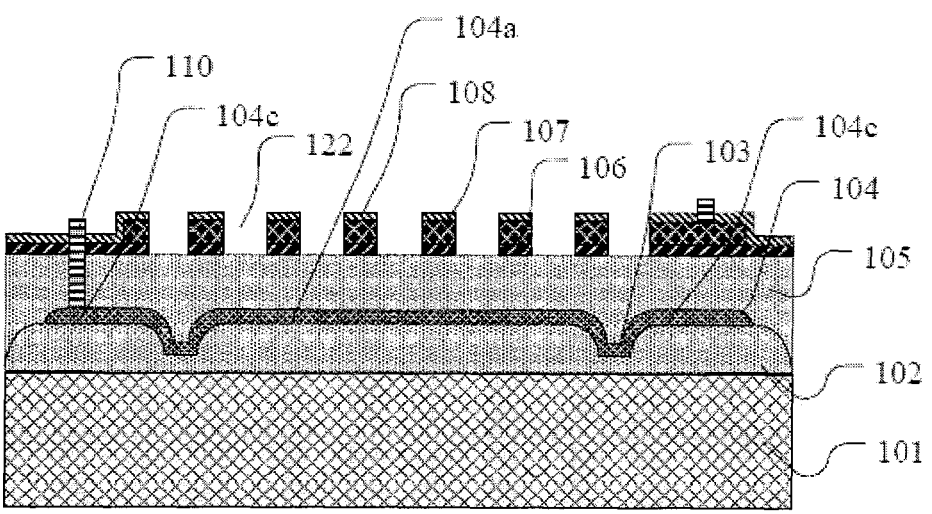

In step S10, release holes 122 penetrating through the second protective layer 108, the backplate electrode 107 and the first protective layer 106 is formed, as shown in FIG. 11.

In the embodiment, a resist layer is formed on the surface of the second protective layer 108, and a pattern including opening is formed in the resist layer by using a photolithography process. By using the resist layer as a mask, a selective etchant is used to remove an exposed portion of the second protective layer 108, the back plate electrode 107, and the first protective layer 106, thereby forming the release holes 122. Due to the selectivity of the etchant, the second isolation layer 105 serves as a stop layer. After the etching, the resist layer can be removed by ashing or dissolving in a solvent.

The step uses, for example, a special deep groove etcher to form the release holes 122.

Figure 12:
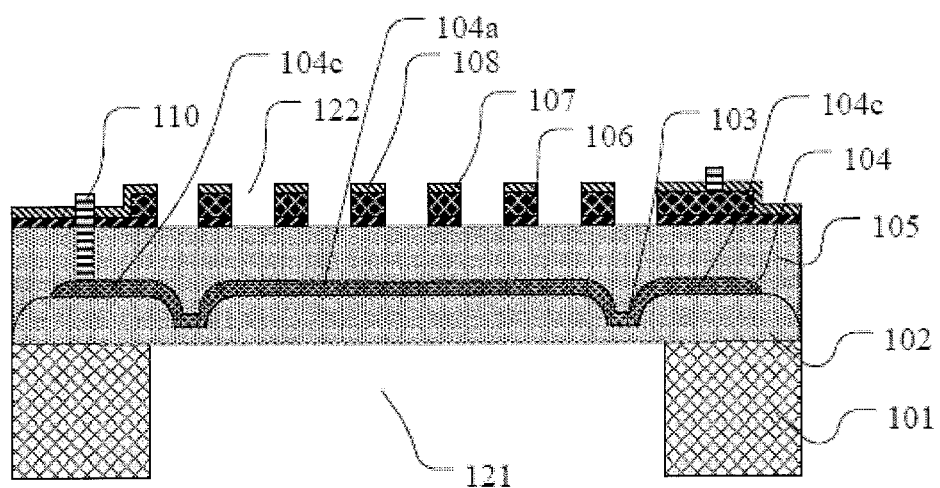

In step S11, an acoustic cavity 121 penetrating the substrate 101 is formed below the diaphragm 104, as shown in FIG. 12.

In the embodiment, the thickness of the substrate 101 is reduced to a preset value by a chemical mechanical planarization process or a thinning process. For example, a first surface and a second surface of the substrate 101 opposite to each other are used to form the above-mentioned first isolation layer 102 and serve as a free surface respectively, and the second surface is polished to reduce the thickness of the substrate 101. Then, a resist layer is formed on the second surface of the substrate 101, and a pattern including opening is formed in the resist layer by a photolithography process. With the resist layer as a mask, an exposed portion of the substrate 101 is removed by using a selective etchant to form the acoustic cavity 121. In the embodiment, the acoustic cavity is a square opening, and alternatively, it may be a trapezoidal or inverted trapezoidal opening. Due to the selectivity of the etchant, the first isolation layer 102 serves as a stop layer. After the etching, the resist layer can be removed by ashing or dissolving in a solvent.

In a preferred embodiment, the area of the backplate electrode 107 is less than or equal to a minimum cross-sectional area of the acoustic cavity 121. More preferably, the area of the back plate electrode 107 is smaller than the minimum cross-sectional area of the acoustic cavity 121. It should be noted that when the opening of the acoustic cavity 121 is square, the cross-sectional areas of the acoustic cavity at different horizontal planes are the same, and the only cross-sectional area is the minimum cross-sectional area of the acoustic cavity 121. When the opening of the acoustic cavity 121 is an inverted trapezoid or a trapezoid, the area of the cross section of the acoustic cavity 121 at the first surface or the second surface of the substrate 101 is the smallest. In some embodiments, the radius of the smallest cross section is from 385 μm to 415 μm.

Figure 13:
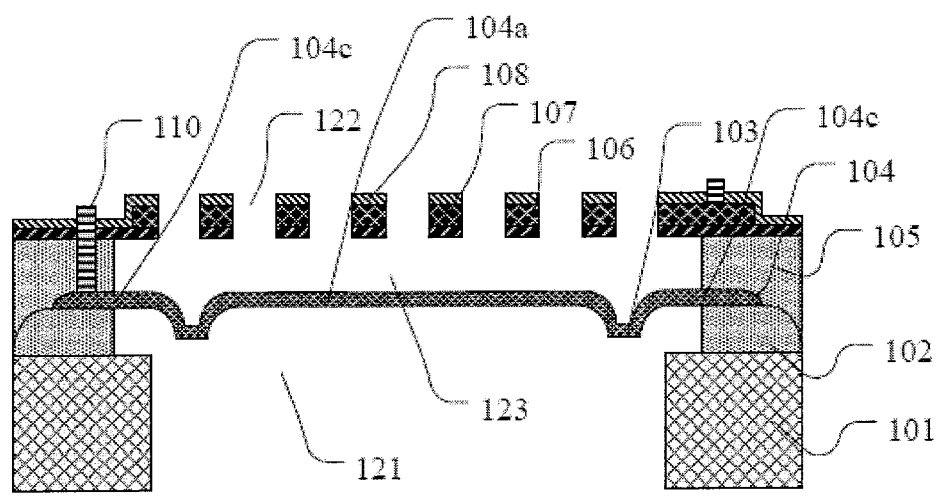

In step S12, a portion of the first isolation layer 102 is removed through the acoustic cavity 121 and a portion of the second isolation layer 105 is removed through the release holes 122, to release the diaphragm 104, as shown in FIG. 13.

In the embodiment, for example, HF acid is used as an etchant, and the acoustic cavity 121 and the release holes 122 formed in the above steps are used as an entry channel for the etchant. The first protective layer 106 and the second protective layer 108 serve as protective films for the backplate electrode 107, respectively, so that the backplate electrode 107 is not etched in the etching step. In the embodiment, the backplate electrode of the MEMS microphone having a multilayer structure is formed by a material having HF resistance, wherein the first protective layer and the second protective layer are used as insulating protective films of the backplate electrode made of polycrystalline in the MEMS microphone, when HF acid vapor fumigation is used to release the sacrificial oxide layer in the device structure, the backplate electrode 107 is still not etched, which improves device performance and reliability.

By using HF acid vapor fumigation or HF acid wet etching, one portion of each of the first isolation layer 102 and the second isolation layer 105 is removed, so that the portions of the first surface and the second surface of the diaphragm 104 opposite to each other are re-exposed, thus releasing the diaphragm 104. After the portion of the first isolation layer 102 is removed, the acoustic cavity 121 extends from the second surface of the substrate 101 to the second surface of the diaphragm 104. After the portion of the second isolation layer 105 is removed, a cavity 123 is formed between the first protective layer 106 and the first surface of the diaphragm 104. The release holes 122 and the cavity 123 communicates with each other, and provide an airflow path during vibration of the diaphragm 104.

In the step, the spring structure 103 of the diaphragm 104 is also exposed in the acoustic cavity 121 and the cavity 123.

Figure 14:
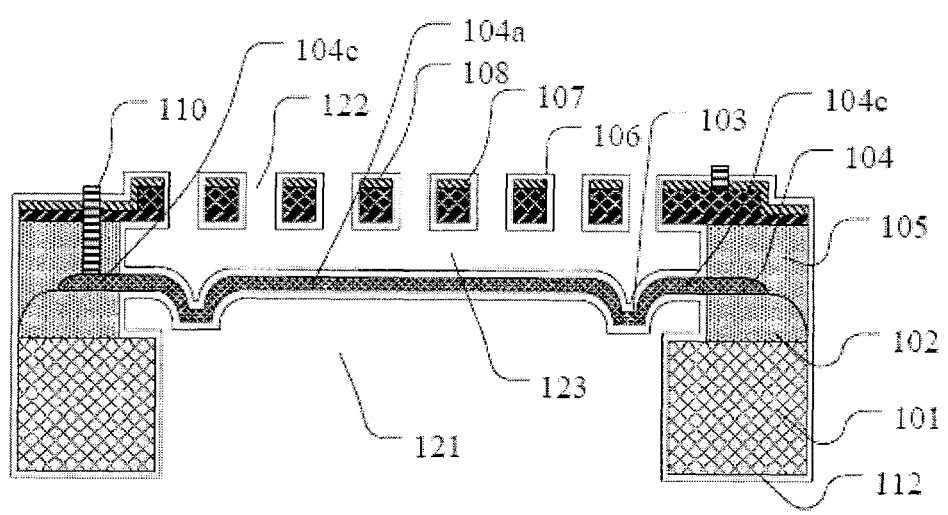

In a preferred embodiment, step S13 is further included. In step S13, a monomolecular layer of organic molecules 112 is formed on an exposed surface of the diaphragm 104, thereby forming a MEMS microphone 100, as shown in FIG. 14.

In the embodiment, the acoustic cavity 121 and the release holes 122 formed in the above steps are used as a supply path of reaction gas, and the monomolecular layer of organic molecules 112 is formed on the exposed surface of the diaphragm 104 by chemical vapor deposition. In a preferred embodiment, the monomolecular layer of organic molecules 112 covers an inner surface communicating with external environment and an exposed outer surface of the MEMS microphone 100.

The monomolecular layer of organic molecules 112 is composed of, for example, any one selected from organosilane and organosiloxane, and has a thickness of, for example, 1 nm to 10 nm. The monomolecular layer of organic molecules 112 has a hydrophobic property and a low surface adhesion force. Therefore, the purpose of preventing adhesion can be achieved without affecting device performance, thereby improving device reliability.

In a preferred embodiment, the MEMS microphone 100 further includes at least one additional film forming a stack structure together with the monomolecular layer of organic molecules 122. The additional film is, for example, a metal oxide film or a silicon oxide film. Atomic layer deposition (ALD) equipments can be used to deposit metal oxide films such as AL2O3 and TiO2, and the thickness of each film is controlled between 1 nm and 3 nm. Silicon oxide films can be deposited by using molecular vapor deposition (MVD) equipments, and the thickness of each film is controlled between 1 nm and 3 nm.

The structure of the MEMS microphone manufactured by the above method is shown in FIG. 14.

The MEMS microphone 100 includes: the first isolation layer 102, the diaphragm 104, and the second isolation layer 105 which are sequentially formed on the substrate 101; the first protective layer 106, the backplate electrode 107 and the second protective layer 108 which are sequentially formed on the second isolation layer 105; the release holes 122 penetrating the first protective layer 106, the backplate electrode 107, and the second protective layer 108; the cavity 123 penetrating the second isolation layer 105, and the cavity 123, the acoustic cavity 121 penetrating the substrate 101 and the first isolation layer 102, wherein, the cavity 123 communicates with the release holes 122, the first surface and the second surface of the diaphragm 104 opposite to each other are exposed through the cavity 123 and the acoustic cavity 121. The first isolation layer 102 and the second isolation layer 105 clamp the peripheral portion of the diaphragm 104.

The diaphragm 104 includes the spring structure 103. The diaphragm 104 further includes the middle portion 104a and the peripheral portion 104c being connected by the spring structure 103. During the vibration of the diaphragm 104, the acoustic cavity 121 and the release holes 122 serve as an airflow path. In an embodiment, the spring structure 103 of the diaphragm 104 is a fold portion of a concentric annular. The concentric annular of spring structure includes 1 to 6 circular rings. In an alternative embodiment, the spring structure 103 of the diaphragm 104 is a fold portion of a spiral structure. Further, the spiral structure of the spring structure includes at least one spiral pattern, and the spiral pattern radiates outward from the middle portion of the diaphragm.

In a preferred embodiment, the diaphragm 104 further includes reinforcing ribs in the peripheral portion, for example, radial strip beams or side wall structure in the peripheral portion. Further, the side wall structure includes a plurality of annular sections. The shape of the annular sections is a rectangular wave shape. Alternatively, the reinforcing ribs include a plurality of annular sections, and the shape of the junctions of the plurality of annular sections are any one of circular arcs, trapezoidal waves with inclination, and sinusoidal waves. The backplate electrode includes a reinforcing structure having protrusions or grooves. Further, the reinforcing structure is, for example, radial strip beams or side wall structure. Further, the side wall structure includes a plurality of annular sections, and the shape of the annular section is a rectangular wave shape. Alternatively, the reinforcing ribs include a plurality of annular sections, and the shape of the junctions of the plurality of annular sections is a circular arc or a trapezoidal wave with inclination or a sinusoidal wave.

In a preferred embodiment, a portion of the diaphragm 104 is a discontinuous region. Further, the edges of the peripheral portion of the diaphragm 104 are discontinuous. Further, the edges of the peripheral portion are zigzag, and a plurality of zigzag-shaped notches form the discontinuous region. In an alternative embodiment, the discontinuous region of the peripheral portion of the diaphragm 104 includes a hollow structure. Further, the hollow structure includes a plurality of through holes, which are polygonal, circular, or trapezoidal.

The diaphragm 104 and the backplate electrode 107 are respectively composed of doped polysilicon. Each of the first protective layer 106 and the second protective layer 108 is composed of any one of a silicon nitride layer, a boron nitride layer, and a silicon carbide layer. The first protective layer 106, the backplate electrode 107, and the second protective layer 108 constitute a back plate structure.

Further, the monomolecular layer of organic molecules 112 covering at least the exposed surface of the diaphragm 104 is further included. Furthermore, the monomolecular layer of organic molecules 112 also covers the exposed surface of the first protective layer 106 in the cavity 123, and the monomolecular layer of organic molecules 112 covers an outer surface of the MEMS microphone and an inner surface communicating with the external environment. The monomolecular layer organic film 112 is composed of any one of an organosilane layer and an organosiloxane layer.

The MEMS microphone 100 further includes the plurality of conductive path 110. Among the plurality of conductive path 110, the first conductive path passes through the second protective layer 108, the first protective layer 106, and the second isolation layer 105 to reach the surface of the diaphragm 104, and the second conductive path passes through the second protective layer 108 to reach the surface of the backplate electrode 107.

In a preferred embodiment, the area of the backplate electrode 107 is less than or equal to the minimum cross-sectional area of the acoustic cavity 121, and more preferably, the area of the backplate electrode is smaller than the minimum cross-sectional area of the acoustic cavity, which can solve the problem of MEMS microphone reliability reduction caused by process fluctuations and improve product performance overall. It should be noted that when the opening of the acoustic cavity 121 is square, the cross-sectional areas of the acoustic cavity at different horizontal planes are the same, and the only cross-sectional area is the minimum cross-sectional area of the acoustic cavity 121. When the opening of the acoustic cavity 121 is an inverted trapezoid or a trapezoid, the area of the cross section of the acoustic cavity 121 at the first surface or the second surface of the substrate 101 is the smallest. In some embodiments, the radius of the smallest cross section is from 385 μm to 415 μm.

In a preferred embodiment, the MEMS microphone 100 further includes at least one additional film forming a stack structure together with the monomolecular layer of organic molecules 122. The additional film is, for example, a metal oxide film or a silicon oxide film. Atomic layer deposition (ALD) equipments can be used to deposit metal oxide films such as AL2O3 and TiO2, and the thickness of each film is controlled between 1 nm and 3 nm. Silicon oxide films can be deposited by using molecular vapor deposition (MVD) equipments, and the thickness of each film is controlled between 1 nm and 3 nm.

In a preferred embodiment, a plurality of protrusions are formed on the surface of the first protective layer 106 facing the diaphragm 104 to prevent adhesion between the back plate electrode 107 and the diaphragm 104.

In a preferred embodiment, the movable region of the diaphragm 104 includes a region corresponding to the middle portion 104a and a region corresponding to the spring structure 103. The movable region of the diaphragm 104 corresponds to a portion of the backplate electrode 107. Further, the back plate electrode 107 is formed above the movable region of the diaphragm 104, and the area of the backplate electrode 107 is smaller than or equal to the area of the movable region of the diaphragm 104. In a preferred embodiment, the area of the backplate electrode 107 is smaller than the area of the movable area of the diaphragm 104. More preferably, the area of the backplate electrode 107 is 70% to 100% of the movable area of the diaphragm 104. By using the backplate electrode having an area less than or equal to the area of the movable area of the diaphragm, an invalid capacitance component can be removed from a detection signal, so that the sensitivity of the detection signal is only relative to valid capacitance component, thereby increasing the sensitivity of the MEMS microphone. MEMS microphone The embodiments in accordance with the present disclosure, as described above, are not described all the details, and are not intended to limit the present disclosure to be only the described particular embodiments. Obviously, many modifications and variations are possible in light of the above. These embodiments have been chosen and described in detail by the specification to explain the principles and embodiments of the present disclosure so that those skilled in the art can make good use of the present disclosure and the modified use based on the present disclosure. The protection scope of the present disclosure should be based on the scope defined by the claims of the present disclosure.

The invention claimed is:

1. A manufacturing method of a MEMS microphone, comprising:
    sequentially forming a first isolation layer, a diaphragm, and a second isolation layer on a substrate;
    sequentially forming a first protective layer, a backplate electrode, and a second protective layer on said second isolation layer;
    forming a release hole penetrating through said first protective layer, said backplate electrode, and said second protective layer;
    forming an acoustic cavity penetrating through said substrate;
    releasing said diaphragm through said acoustic cavity and said release hole;
    forming a monomolecular layer of organic molecules on at least an exposed surface of said diaphragm for reducing or preventing adhesion between said diaphragm and said backplate electrode; and
    forming a groove on a surface of said first isolation layer between said step of forming said first isolation layer and said diaphragm, wherein said diaphragm conformally covers said surface of said first isolation layer, thereby forming a spring structure at a position of said groove.

2. The manufacturing method according to claim 1, wherein in the step of releasing said diaphragm, a portion of said first isolation layer is removed through said acoustic cavity, and a portion of said second isolation layer is removed through said release hole, thereby exposing a first surface and a second surface of said diaphragm opposite to each other.

3. The manufacturing method according to claim 2, wherein in the step of releasing the diaphragm, HF acid is used as an etchant, said diaphragm is used as a stop layer, said first protective layer and said second protective layer are used to protect said backplate electrode.

4. The manufacturing method according to claim 1, further comprising:
    forming at least one additional film selected from a metal oxide film and a silicon oxide film on a surface of said monomolecular layer of organic molecules, wherein said additional film and said monomolecular layer of organic molecules form a stack structure.

5. The manufacturing method according to claim 1, wherein, in the step of releasing said diaphragm, a cavity is formed between said first protective layer and said diaphragm.

6. The manufacturing method according to claim 5, wherein said monomolecular layer of organic molecules covers an inner surface communicating with external environment and an outer surface of said MEMS microphone.

7. The manufacturing method according to claim 6, wherein, in the step of forming a monomolecular layer of organic molecules, said monomolecular layer of organic molecules covers an exposed surface of said first protective layer in said cavity.

8. The manufacturing method according to claim 1, wherein said diaphragm and said backplate electrode are each composed of doped polysilicon.

9. The manufacturing method according to claim 1, wherein each of said first protective layer and said second protective layer is composed of any one selected from silicon nitride, boron nitride, and silicon carbide.

10. The manufacturing method according to claim 1, wherein said spring structure of said diaphragm is a fold portion of a concentric annular, or a fold portion of a spiral structure.

11. The manufacturing method according to claim 10, wherein said spring structure of said concentric annular comprises one to six circular rings.

12. The manufacturing method according to claim 10, wherein, said spring structure of said spiral structure comprises at least one spiral pattern, and said spiral pattern radiates outward from a middle portion of said diaphragm.

13. The manufacturing method according to claim 1, further comprising:
    forming reinforcing ribs in a peripheral portion of said diaphragm.

14. The manufacturing method according to claim 13, wherein said reinforcing ribs of said diaphragm are radial strip beams or side wall structure in said peripheral portion.

15. The manufacturing method according to claim 1, further comprising:
    forming a discontinuous region in a part of said peripheral portion of said diaphragm.

16. The manufacturing method according to claim 1, wherein a plurality of protrusions are formed on a surface of said first protective layer facing said diaphragm, to prevent adhesion between said backplate and said diaphragm.

17. The manufacturing method according to claim 1, wherein, further comprising: between the steps of forming said backplate electrode and said second protective layer, patterning said backplate electrode.

18. The manufacturing method according to claim 17, further comprising:
in a region where a portion of said backplate electrode is removed during patterning, a first conductive path is formed that passes through said second protective layer, said first protective layer, and said second isolation layer and reaches a surface of said diaphragm; and
In a region where a portion of said backplate electrode is remained during patterning, a second conductive path is formed that passes through said second protective layer and reaches a surface of said backplate electrode.

19. The manufacturing method according to claim 1, wherein said monomolecular layer of organic molecules is composed of any one of organosilane and organosiloxane.

20. The manufacturing method according to claim 1, wherein said backplate electrode is formed above a movable region of said diaphragm, and an area of said backplate electrode is less than or equal to that of said movable area of said diaphragm.

21. The manufacturing method according to claim 1, wherein an area of said backplate electrode is less than or equal to a minimum cross-sectional area of said acoustic cavity.

22. The manufacturing method according to claim 21, wherein a minimum cross-sectional radius of said acoustic cavity is from 385 μm to 415 μm.

23. The manufacturing method according to claim 1, wherein said first protective layer and said second protective layer have different thicknesses.

24. The manufacturing method according to claim 23, wherein said first protective layer has a thickness from 800 angstroms to 1500 angstroms, and said second protective layer has a thickness from 0.1 μm to 1.0 μm.

25. The manufacturing method of claim 1, wherein said first protective layer and said second protective layer have different materials.

26. A MEMS microphone, comprising:
a first isolation layer, a diaphragm, and a second isolation layer sequentially formed on a substrate;
a first protective layer, a backplate electrode, and a second protective layer sequentially formed on said second isolation layer;
a release hole penetrating through said first protective layer, said backplate electrode, and said second protective layer;
a cavity penetrating through said second isolation layer, wherein said cavity communicates with said release hole;
an acoustic cavity penetrating through said substrate and said first isolation layer;
a monomolecular layer of organic molecules covering at least an exposed surface of said diaphragm for reducing or preventing adhesion between said diaphragm and said backplate electrode; and
a spring structure provided on a surface of said diaphragm, wherein a first and second surfaces of said diaphragm opposite to each other are exposed through said cavity and said acoustic cavity, respectively.

27. The MEMS microphone according to claim 26, further comprising: at least one additional film formed on a surface of said monomolecular layer of organic molecules and selected from a metal oxide film and a silicon oxide film, and said additional film and said monomolecular organic film form a stack structure.

28. The MEMS microphone according to claim 26, wherein said monomolecular layer of organic molecules covers an inner surface communicating with external environment and an outer surface of said MEMS microphone.

29. The MEMS microphone according to claim 26, wherein said monomolecular layer of organic molecules covers an exposed surface of said first protective layer in said cavity.

30. The MEMS microphone according to claim 26, wherein said diaphragm and said backplate electrode are each composed of doped polysilicon.

31. The MEMS microphone according to claim 26, wherein each of said first protective layer and said second protective layer is any one selected from a silicon nitride layer, a boron nitride layer, and a silicon carbide layer, said first protective layer and said second protective layer have different materials.

32. The MEMS microphone according to claim 26, wherein said spring structure of said diaphragm is a fold portion of a concentric annular, or a fold portion of a spiral structure.

33. The MEMS microphone according to claim 32, wherein said spring structure of said concentric annular comprises one to six circular rings.

34. The MEMS microphone according to claim 32, wherein, said spring structure of said spiral structure comprises at least one spiral pattern, and said spiral pattern radiates outward from a middle portion of said diaphragm.

35. The MEMS microphone according to claim 26, further comprising:
reinforcing ribs formed in a peripheral portion of said diaphragm.

36. The MEMS microphone according to claim 35, wherein said reinforcing ribs of said diaphragm are radial strip beams or a side wall structure in said peripheral portion.

37. The MEMS microphone according to claim 26, further comprising: a discontinuous region formed in a part of said peripheral portion of said diaphragm.

38. The MEMS microphone according to claim 26, further comprising:
a first conductive path passing through said second protective layer, said first protective layer, and said second isolation layer to reach a surface of said diaphragm; and
a second conductive path passing through said second protective layer to reach a surface of said backplate electrode.

39. The MEMS microphone according to claim 26, wherein said monomolecular layer of organic molecules is composed of any one of an organosilane layer and an organosiloxane layer.

40. The MEMS microphone according to claim 26, wherein a plurality of protrusions are formed on a surface of said first protective layer facing said diaphragm, to prevent adhesion between said backplate and said diaphragm.

41. The MEMS microphone according to claim 26, wherein said backplate electrode is formed above a movable region of said diaphragm, and an area of said backplate electrode is less than or equal to that of said movable area of said diaphragm.

42. The MEMS microphone according to claim 41, wherein an area of said backplate electrode is from 70% to 100% of said movable region.

43. The MEMS microphone according to claim 41, wherein said diaphragm further comprises: a middle portion and a peripheral portion being connected by said spring structure, and said movable region of said diaphragm comprises a region corresponding said middle portion and a region corresponding to said spring structure.

44. The MEMS microphone according to claim 26, wherein an area of said backplate electrode is less than or equal to a minimum cross-sectional area of said acoustic cavity.

45. The MEMS microphone according to claim 44, wherein a minimum cross-sectional radius of said acoustic cavity is from 385 µm to 415 µm.

46. The MEMS microphone according to claim 26, wherein said backplate electrode has a thickness from 0.3 µm to 1.0 µm.

47. The MEMS microphone according to claim 26, wherein said first protective layer and said second protective layer have different thicknesses.

48. The MEMS microphone according to claim 47, wherein said first protective layer has a thickness from 800 angstroms to 1500 angstroms, and said second protective layer has a thickness from 0.1 µm to 1.0 µm.

49. The MEMS microphone according to claim 26, wherein said monomolecular layer of organic molecules has a thickness from 1 nm to 10 nm.

\* \* \* \* \*